United States Patent [19]

Winterling

[11] 4,389,534
[45] Jun. 21, 1983

[54] AMORPHOUS SILICON SOLAR CELL HAVING IMPROVED ANTIREFLECTION COATING

[75] Inventor: Gerhard Winterling, Ottobrunn, Fed. Rep. of Germany

[73] Assignee: Messerschmitt-Bölkow-Blohm GmbH, Fed. Rep. of Germany

[21] Appl. No.: 329,999

[22] Filed: Dec. 11, 1981

[30] Foreign Application Priority Data

Dec. 22, 1980 [DE] Fed. Rep. of Germany ....... 3048381

[51] Int. Cl.³ ............................................ H01L 31/04
[52] U.S. Cl. .................................. 136/256; 136/258; 357/30
[58] Field of Search ......... 136/256, 258 AM, 258 PC; 357/30

[56] References Cited

U.S. PATENT DOCUMENTS 4,285,762  8/1981  Moustakas ......................... 156/643

OTHER PUBLICATIONS

B. Gandham et al., "Antireflection Coatings on Solar Cells," *Solar Cells*, vol. 1, pp. 3–22 (1979/80).
B. S. Verma et al., "Design of Antireflection Coatings," *Thin Solid Films*, vol. 44, pp. L9–L12 (1977).
P. A. Iles, "Antireflection Coatings for Solar Cells," *J. Vac. Sci. Technol.*, vol. 14, pp. 1100–1105 (1977).
V. K. Dalal, "Analysis of Amorphous Silicon Solar Cells," *Solar Cells*, vol. 2, pp. 261–273 (1980).

*Primary Examiner*—Aaron Weisstuch
*Attorney, Agent, or Firm*—McGlew and Tuttle

[57] ABSTRACT

A semiconductor solar cell for the conversion of light to electric energy comprises at least one layer of amorphous silicon, a cover layer of poly-crystalline silicon and an anti-reflection layer of semiconducting transparent oxide of a refractive index of less than 2.8. The cover layer of poly-crystalline silicon has an optical density $$\frac{\lambda_{light}}{4}$$

or it may be $$\frac{3\lambda_{light}}{4}.$$

The cover layer is arranged between the anti-friction layer and the layer of amorphous silicon.

1 Claim, 2 Drawing Figures

AMORPHOUS SILICON SOLAR CELL HAVING IMPROVED ANTIREFLECTION COATING

FIELD AND BACKGROUND OF THE INVENTION

The invention relates in general to semiconductors and in particular to a new and useful semiconductor component for the conversion of light to electric energy having at least one layer of amorphous silicon and a cover layer of polycrystalline silicon and an anti-reflection layer.

In German patent application No. P 29 38 260.3; U.S. application Ser. No. 188,725 filed Sept. 19, 1980, and now abandoned, it is described how, by the use of a cover layer of polycrystalline silicon on the semiconductor layer of amorphous silicon, the blue yield of solar cells of p-i-n structure and hence the efficiency can be substantially improved. It was pointed out in this patent application that a thin poly-crystalline silicon layer is useful in an a-Si cell to help eliminate the light absorption in the highly doped silicon contact layer on the light incidence side.

In optimizing the efficiency of solar cells, it is important, besides improving the internal collector efficiency, i.e. of the electric charge carriers produced by light absorption, to find ways to let the incident light penetrate into the active cell material without reflection losses.

According to the prior art, see e.g. U.S. Pat. No. 4,064,521 column 3, lines 38 ff, the reflection losses are minimized by applying (transparent) anti-reflection layers, (see FIG. 1) in which 1 denotes a cover plate, 2 the anti-reflection layer, and 3 the layer of a-Silicon (Si).

In the simplest case, when the reflecting extinction is to take place only in a limited spectral region and economically, the anti-reflection layer 2 has the optical layer thickness of a quarter wavelength ($\lambda/4$), where for extinction the refractive index $n_{AR}$ of the anti-reflection layer depends on the refractive indices of the adjacent media 1 and 2 according to the equation $n_{AR}=\sqrt{n_1 n_2}$.

For semiconductor components of crystalline Si (with $n_{x-Si}$ approx. 4 at 6000 A one uses as the material for the anti-reflection layer SiO, TiO$_x$(n=2.3), Ta$_2$O$_5$(n=2.05), tin oxide (n approx. 2), and indium tin oxide (n approx. 2).

For semiconductor components based on amorphous silicon (a-Si), which have become of great interest recently because of the possibility of cheap manufacture, usually indium tin oxide (ITO) has been used as an anti-reflection layer. Just as SnO$_2$, ITO offers the further advantage that due to its high electric conductivity (transparent semiconductor) it contributes greatly to the reduction of the electric layer resistance on the light incidence side in a-Si cells. Therefor, electrode grid structures of greater inter grid spacing become possible.

Now both indium tin oxide and tin oxide are suitable for reduction of the reflection loss on crystalline Si; however, when used on a-Si there remains a residual reflection R=10% in the green region of the spectrum (FIG. 1), as the refractive index of a-Si with $\simeq 5$ is substantially higher than that of crystalline Si. For minimized the residual reflection on a-Si, an anti-reflection layer with refractive index $n_{AR}=\sqrt{n_{glass} \times n_{a-Si}} \simeq 2.8$ would be necessary, for which one could use for example TiO$_x$ with $x\simeq 2$. TiO$_2$ and also other transparent materials of comparably high refractive index have, however, a low electric conductivity and therefore cannot make the desired contribution to the reduction of the layer resistance.

SUMMARY OF THE INVENTION

The present invention provides a semiconductor device where the reflection losses are minimized and the high layer resistance of the a-Si layer is reduced.

This problem is solved in that the cover layer of poly-crystalline silicon has the optical density $$\frac{\lambda_{light}}{4} \text{ or } \frac{3\lambda_{light}}{4}$$

and that the cover layer is arranged between the anti-reflection layer of semiconducting transparent oxide with a refractive index <2.8 and the layer of amorphous silicon.

The reflection losses are reduced almost by a factor of 7. The poly-crystalline Si layer has the further advantage that, unlike the doped a-Si layer, the charge carriers produced in it by the residual light absorption have the chance to contribute to the photo-electric current and hence to an improvement of the efficiency.

Accordingly, it is an object of the invention to provide a semiconductor component for the conversion of light to electric energy which has at least one layer of amorphous silicon, a cover layer of poly-crystalline silicon and an anti-reflection layer of semiconducting transparent oxide of refractive index less than 2.8 which is characterized in that the cover layer of poly-crystalline silicon has an optical density of $$\frac{\lambda_{light}}{4} \text{ or } \frac{3\lambda_{light}}{4}$$

and is arranged between the anti-reflection layer and the layer of amorphous silicon.

A further object of the invention is to provide a semiconductor component which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 2:
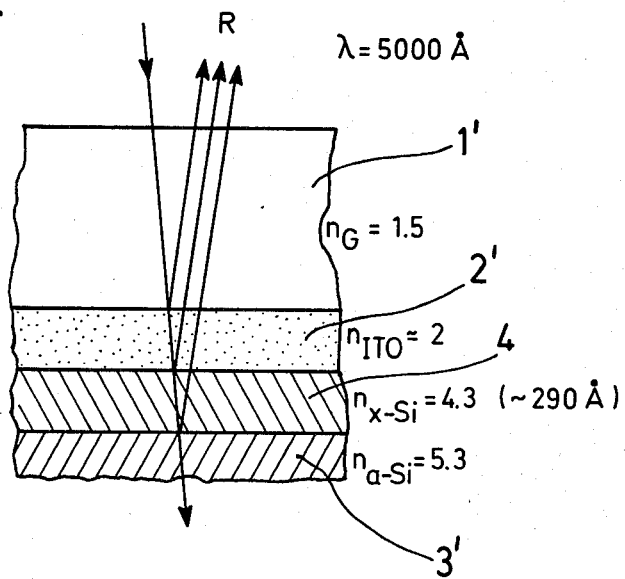
FIG. 2 is a view similar to FIG. 1 showing the invention of a semiconductor component for the conversion of light to electrical energy.

Referring to FIG. 2 in particular, the invention embodied therein comprises a semiconductor component for the conversion of light to electric energy which comprises at least one layer of amorphous silicon, for example the layer 3' with a cover layer of poly-crystalline silicon designated 4. An anti-reflection layer of semiconducting transparent oxide of a refractive index less that 2.8 is designated 2' and the numeral 1' designates a cover plate.

The reflection losses are minimized by interposition of a cover layer 4 of poly-crystalline Si between the anti-reflection layer 2 and the layer 3' of a-Si. The optical thickness of the cover layer 4 is λ/4, as shown in FIG. 2 in an example with ITO. The geometric thickness of a λ/4 poly-crystalline Si layer is $$d = \frac{\lambda_{light}}{4n} \simeq 290 \text{ A}$$

if the reflection extinction is selected as to center of gravity at the light wavelength 5000 A.

The reflection loss can easily be calculated by substituting in the following formula:

$$R = \left[ \frac{n_{ITO} - n_G}{n_{ITO} + n_G} - \frac{n_{x-Si} - n_{ITO}}{n_{x-Si} + n_{ITO}} + \frac{n_{x-Si} - n_{a-Si}}{n_{xSi} + n_{a-Si}} \right]^2$$

wherein
R = reflection loss
$n_i$ = refractive indices

Figure 1:
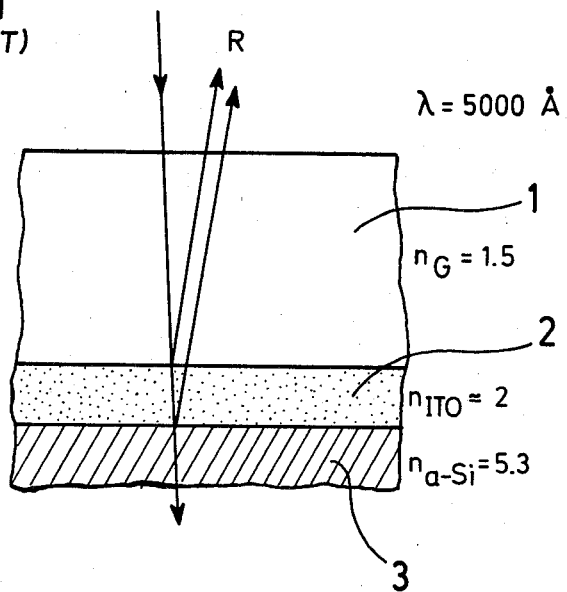
FIG. 1 is a large sectional view of a semiconductor component of the prior art.

The reflection loss is found to be R≃1.4% and thus is considerably lower than R=9.5% without employing the invention (see FIG. 1), that is, when operating in the conventional way, without the additional poly-crystalline Si layer.

While a specific embodiment of the invention has been shown and described in detail to illustrate the application of the principles of the invention, it will be understood that the invention may be embodied otherwise without departing from such principles.

What is claimed is:

1. A semiconductor component for the conversion of light to electric energy, comprising at least one layer of amorphous silicon, a cover layer of poly-crystalline silicon, and an anti-reflection layer of semiconducting transparent oxide of a refractive index less that 2.8, said cover layer of poly-crystalline silicon having an optical density of $$\frac{\lambda_{light}}{4} \text{ or } \frac{3\lambda_{light}}{4}$$

and being arranged between said anti-reflection layer and said layer of amorphous silicon.

* * * * *